United States Patent
Wagner et al.

[11] Patent Number: 5,872,486
[45] Date of Patent: Feb. 16, 1999

[54] WIDE-RANGE FINE-STEP VECTOR MODULATOR FREQUENCY SYNTHESIZER

[75] Inventors: Gary L. Wagner, Menlo Park; Louis J. Dietz, Mountain View, both of Calif.

[73] Assignee: Trimble Navigation Limited, Sunnyvale, Calif.

[21] Appl. No.: 829,977

[22] Filed: Apr. 1, 1997

[51] Int. Cl.⁶ .................................................. H03L 7/081
[52] U.S. Cl. ............................ 331/1 A; 331/16; 327/107; 327/159; 375/376
[58] Field of Search ..................................... 332/103, 104; 327/105, 107, 159; 331/14, 16; 375/376

[56] References Cited

U.S. PATENT DOCUMENTS 5,444,420  8/1995  Wernlund ................................. 331/1 R Primary Examiner—Arnold Kinkead
Attorney, Agent, or Firm—Thomas E. Schatzel; Law Offices of Thomas E. Schatzel, A Professional Corp.

[57] ABSTRACT

A frequency synthesizer comprises a voltage controlled oscillator (VCO) with an output frequency $f_{out}$ that is dependent on a VCO-control voltage input. A divide-by-k counter is connected to receive the output frequency $f_{out}$ and to output a pair of in-phase and quadrature phase signals $f_k$. A vector modulator is connected to receive the in-phase and quadrature phase signals $f_k$ and the output frequency $f_{out}$, and outputs a single sideband (SSB) modulated output $f_n$ comprising only one of the sum ($f_{out}+f_k$) or difference ($f_{out}-f_k$) products. A divide-by-n counter is connected to receive the modulated output $f_n$ and to output a feedback frequency sample $f_f$. And a phase detector is connected to receive the feedback frequency sample $f_f$ and to compare it with a reference frequency $f_r$. A phase error output signal is provided for the VCO-control voltage input.

5 Claims, 1 Drawing Sheet

WIDE-RANGE FINE-STEP VECTOR MODULATOR FREQUENCY SYNTHESIZER

BACKGROUND OF THE INVENTION

1. Field of the Invention

The invention relates generally to electronic frequency synthesizer circuits and more specifically to single phase locked loops that use a vector modulator to synthesize a wide range of frequencies in very fine digitally controlled steps.

2. Description of the Prior Art

Conventional phase locked loops (PLLs) are ubiquitous in all kinds of communications and navigation equipment. A single frequency reference provided by a crystal oscillator is conventionally mixed with the output of a divide-by-n digital divider connected to a voltage controlled oscillator (VCO). A phase detector is used to compare the divider output frequency and phase to the reference frequency. An error signal drives the VCO in such a direction that the VCO output settles exactly on the nth multiple of the reference frequency. So the accuracy and stability of the reference frequency is imparted to the VCO output frequency. Different frequencies can be synthesized by changing the divisor n, and/or the reference frequency.

Circuit applications that require a very wide range of frequencies and a very fine step size between synthesized frequencies have traditionally meant that multiple PLLs had to be used and their outputs mixed together to generate sum and difference products. Such complex circuits are expensive to manufacture and not as robust and trouble-free as particular applications demand. For example, satellite communications transceivers need to be able to synthesize many different carrier frequencies in the 1.6 GHz band that are separated by as little as fifty hertz. Such fine granularity is necessary to track microwave radio carriers that are Doppler shifted by varying amounts by the relative velocities of the orbiting satellites and mobile transceivers.

SUMMARY OF THE PRESENT INVENTION

It is therefore an object of the present invention to provide a frequency synthesizer that has a wide range.

It is another object of the present invention to provide a frequency synthesizer that has very fine steps between synthesized frequencies.

It is still another object of the present invention to provide a frequency synthesizer that is simple and inexpensive to manufacture.

Briefly, a frequency synthesizer embodiment of the present invention comprises a voltage controlled oscillator (VCO) with an output frequency $f_{out}$ that is dependent on a VCO-control voltage input. A divide-by-k counter and a two-stage divide-by-four pair of flip-flops are connected to receive the output frequency $f_{out}$ and to output a pair of in-phase and quadrature phase signals $f_k$. A vector modulator is connected to receive the in-phase and quadrature phase signals $f_k$ and the output frequency $f_{out}$, and outputs a single sideband (SSB) modulated output $f_n$ comprising only one of the sum ($f_{out}+f_k$) or difference ($f_{out}-f_k$) products. A divide-by-n counter is connected to receive the modulated output $f_n$ and to output a feedback frequency sample $f_f$. And a phase detector is connected to receive the feedback frequency sample $f_f$ and to compare it with a reference frequency $f_r$. A phase error output signal is provided for the VCO-control voltage input.

An advantage of the present invention is that a frequency synthesizer is provided that provides both a wide range of synthesized frequencies and in very fine steps.

Another advantage of the present invention is that a frequency synthesizer is provided that is simple and avoids the use of multiple synthesizers to generate a wide range of synthesized frequencies in very fine steps.

These and other objects and advantages of the present invention will no doubt become obvious to those of ordinary skill in the art after having read the following detailed description of the preferred embodiment that is illustrated in the drawing figure.

IN THE DRAWINGS

FIG. 1 is a schematic diagram of a frequency synthesizer embodiment of the present invention.

DETAILED DESCRIPTION OF THE PREFERRED EMBODIMENT

Figure 1:
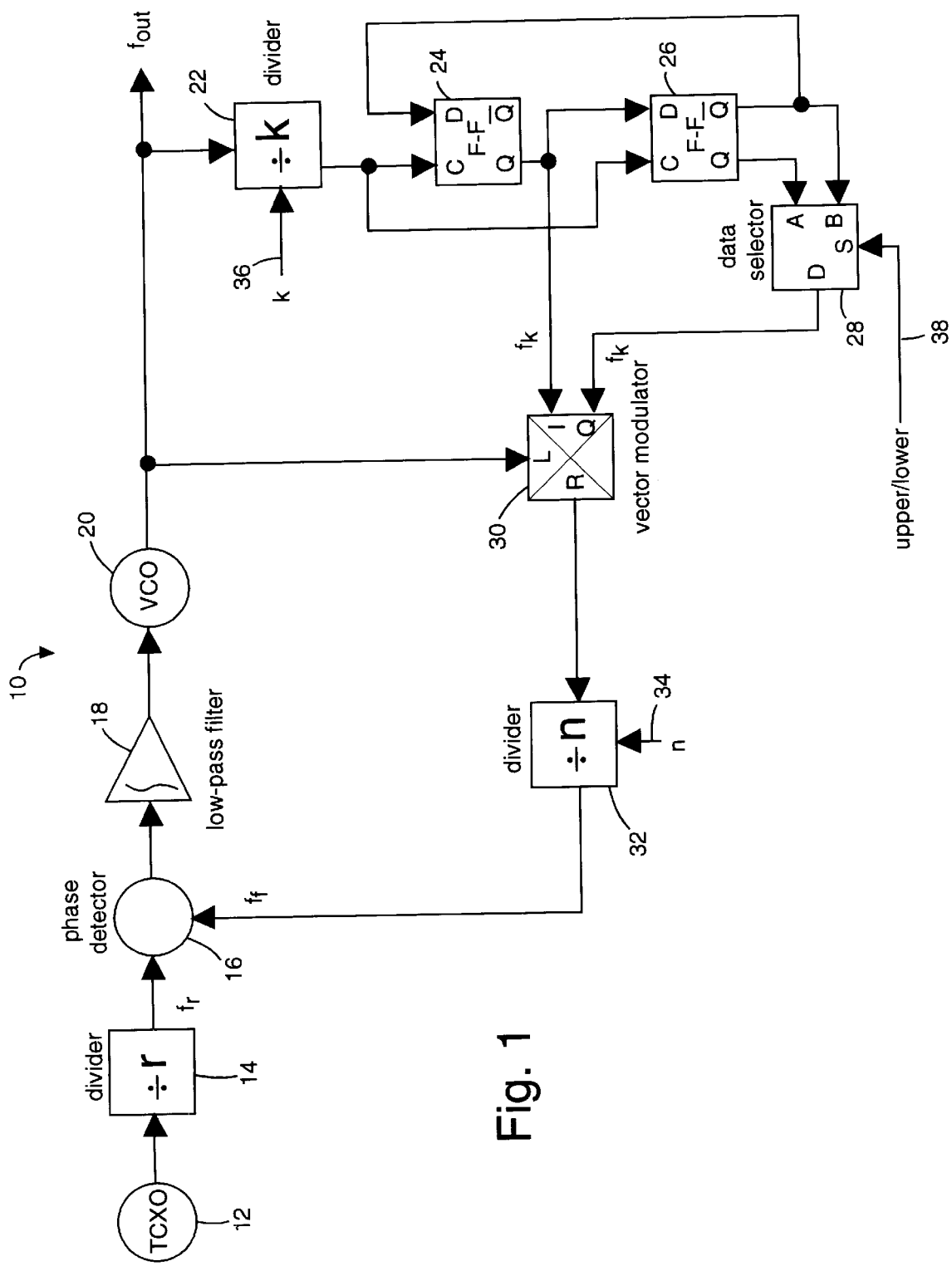

FIG. 1 illustrates a frequency synthesizer embodiment of the present invention, referred to herein by the general reference numeral 10. The frequency synthesizer 10 comprises a temperature compensated crystal oscillator (TCXO) 12 connected to a divider 14. A reference frequency $f_r$ is output from the divider 14 for comparison with a phase locked loop feedback signal by a phase detector 16. A phase error difference output signal from the phase detector 16 is integrated by a low-pass filter (LPF) 18. A voltage controlled oscillator (VCO) 20 is capable of outputting the full range of output frequencies $f_{out}$ required from frequency synthesizer 10, given a proper input voltage from the LPF 18. A programmable divide-by-k digital divider 22 provides a sub-harmonic of $f_{out}$ to clock a pair of flip-flops (F-F) 24 and 26 that implement a divide by four counter. The F-F 24 provides an in-phase (I) output $f_k$. The F-F 26 provides a quadrature-phase (Q) output, and its complement, which is also $f_k$. A two-input data selector 28 enables either the affirmative or complement quadrature-phase (Q) output from F-F 26 to be applied to the inputs of a vector modulator 30. An exclusive-or gate can be used to implement the data selector 28.

The vector modulator 30 also receives a sample of $f_{out}$ to produce an output that approximates the $n^{th}$ multiple of $f_r$. So, $$nf_r = f_0 \pm \frac{f_0}{4k} = f_0 \left(1 \pm \frac{1}{4k}\right),$$

where n provides coarse steps or range selection, and k provides fine step selection. The output of the vector modulator 30 is applied to a divide-by-n divider 32. An output from divider 32 approximates $f_r$ and its difference from $f_r$ will be detected by the phase detector 16. The error output from the phase detector 16 via the LPF 18 will cause the VCO 20 to produce a $f_{out}$ that does result in the output of the divider 32 equaling $f_r$. This form of closed loop servo control resembles conventional phase locked loops, but has a much wider range and a much finer selection of steps.

The vector modulator 30 is used instead of the traditional mixer which is common to prior art PLLs. The advantage is that both sum and difference products are not produced, as is the case for conventional PLL mixers. Such vector modulators actually comprise two mixers, a 90° phase shifter, and a summer connected to generate only the sum or the difference products. The unwanted product which is not selected is typically thirty dB down from the selected one. So substituting a vector modulator for a simple mixer eliminates the need for complex and expensive bandpass filters to reject the undesired mixer output.

Suitable devices for use as the vector modulator 30 are marketed by Siemens Components, Inc. (Cupertino, Calif.). Three highly-integrated vector modulator and mixer circuits are available for wide frequency ranges up to 2.5 Ghz. The PMB2201, PMB2202, and PMB2207 include both a direct quadrature modulator and a double-balanced Gilbert cell mixer with the according bias circuitry on the same chip, thus simplifying design. The modulators and mixers have separate power supplies and grounds, and can be powered down separately. Due to the power-down concept, the modulator can be used either without or in conjunction with the up/down conversion mixer part. The up/down conversion mixer combines two external signals at the radio frequency (RF) and intermediate frequency (IF) inputs. The IF input is suited for lower frequency signals because of the linear transfer function the mixer output. The higher-frequency signals are fed to the RF input to switch the Gilbert dell mixer. The PMB2201 is intended for applications with frequency ranges from 800 MHz to 1.5 GHz (GSM, PDC-800, PDC-1.5, DAMPS, etc.). The PMB2202 is intended for use in frequency ranges from 1.4 GHz to 2.5 GHz (PDC-1.5, DCS-1800, PCS-1900, WLAN, etc.). The PMB2207 operates in a frequency range of 80 to 800 MHz.

Another device suitable for use as the vector modulator 30 is marketed by RF Micro Devices (Greensboro, N.C.) as the RF2402 UHF quadrature modulator. The RF2402 is a monolithic integrated modulation system capable of generating amplitude modulation (AM), frequency modulation (FM), phase modulation (PM), single sideband (SSB), double sideband (DSB), and compound carriers in the UHF frequency spectrum. Differential amplifiers are provided for baseband inputs, together with a 90° hybrid phase splitter, limiting local oscillator (LO) amplifiers, two balanced mixers, a combining amplifier, and a 50-ohm line driver RF output amplifier.

The present invention differs from the prior art by using a frequency-divided version of the PLL output signal to generate the fine-stepping frequency signal. Such signal is fed back into the PLL through the mixer, which forces the loop to offset the output frequency in non-uniform fine steps. The fine steps are not uniform due to the combinations of n, k, and U/L that can be programmed in. But such lack of uniformity is not a serious impediment for modern communications systems that use digital signal processing for baseband operations.

The present invention also differs from the prior art by digitally switching between the upper and lower sideband outputs of the vector modulator. Such switching completes the fine-step (k) frequency coverage between the coarse frequency steps (n) of the main loop with practical divider ratios, and is easily implemented with ordinary digital circuitry.

A conventional frequency-following switched capacitor filter can be alternatively included to lowpass filter the I and Q input signals to the vector modulator 30. The lowpass filter must attenuate the harmonics of the I and Q signals. Such harmonics can be "aliased" down to baseband by the sampling process of the PLL's phase detector, causing low-offset-frequency sidebands on the output signal. Such aliasing products are only attenuated by the PLL's low-pass frequency response if the frequency of the aliased product is greater than the PLL's bandwidth. Since the squarewave I and Q signals from F-F's 24 and 26 can span an octave or more of bandwidth, it is difficult to design a low-pass filter that can provide adequate attenuation of the third harmonic of the lowest I/Q frequency, and yet still pass the highest frequency.

Switched capacitor filters have a frequency cutoff that is proportional to a clock frequency. If the clock signal is generated so that it "scales" with the fine offset frequency, then the filter function automatically tracks the offset signal to provide optimum filtering.

The output frequency $f_{out}$ is programmed by supplying a value n on an input line 34, a value k on an input line 36, and an upper/lower (U/L) sideband selection signal to an input line 38. Different values of n, k, and U/L are needed to produce a range of output frequencies $f_{out}$ in fine steps. In general, $$f_0 = \frac{4knf_r}{4k \pm 1},$$

where the ± represents the selection between upper and lower sidebands for input to the vector modulator 30 by the data selector 28.

In experiments, it was observed that particular, but predictable, combinations of n, k, and U/L will produce spurious output signals. Such problems can be avoided by filtering the squarewave I and Q signals input to the vector modulator 30 to approximate sinewaves. Another solution includes changing the frequency plan by switching in a different TCXO with a different reference frequency $f_r$. In which case appropriate, and non-problematic values of n, k, and U/L are selected, e.g., by microcomputer.

A frequency plan that has been used by the present inventors was such that the TCXO 12 operated at 12.5 MHz. The reference frequency $f_r$ was then 250 KHz. The VCO 20 was configured to produce a nominal 1.6 GHz output frequency $f_{out}$. Various values k were supplied to the divider 22, and included 3200 for an $f_k$ of 125 KHz and a step size of 39.075 Hz, and a value of 1600 for an $f_k$ of 250 KHz which results in a step size of 156.104 Hz.

Although the present invention has been described in terms of the presently preferred embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A frequency synthesizer, comprising:

a voltage controlled oscillator (VCO) having an output frequency $f_{out}$ that is dependent on a VCO-control voltage input;

a divide-by-k counter and a further divider stage outputting a pair of in-phase and quadrature-phase signals $f_k$, the divide-by-k counter connected to receive said output frequency $f_{out}$;

a vector modulator connected to receive said in-phase and quadrature phase signals $f_k$ and said output frequency $f_{out}$, and to output a single sideband (SSB) modulated output $f_n$ comprising only one of the sum ($f_{out}+f_k$) or difference ($f_{out}-f_k$) products;

a divide-by-n counter connected to receive said modulated output $f_n$ and to output a feedback frequency sample $f_f$; and a phase detector connected to receive said feedback frequency sample $f_f$ and to compare it with a reference frequency $f_r$, and having a phase error output signal for connection to said VCO-control voltage input;

wherein, the output frequency $f_{out}$ is such that, $$f_o = \frac{4knf_r}{4k \pm 1},$$

where the ±1 term represents a selection between one of said sum ($f_{out}+f_k$) or difference $f_{out}-f_k$) products.

2. The frequency synthesizer of claim 1, wherein:
 a data selector is connected to select between the affirmative or complement of said quadrature phase signal $f_k$ for input to the vector modulator for said selection between one of said sum ($f_{out}+f_k$) or difference ($f_{out}-f_k$) products.

3. The frequency synthesizer of claim 1, further comprising:
 a crystal oscillator connected to provide said reference frequency $f_r$ to the phase detector.

4. A frequency synthesizer, comprising:
 a voltage controlled oscillator (VCO) having an output frequency $f_{out}$ that is dependent on a VCO-control voltage input;
 a divide-by-k counter and a further divider stage outputting a pair of in-phase and quadrature-phase signals, $f_k$, the divide-by-k counter connected to receive said output frequency $f_{out}$;
 a vector modulator connected to receive said in-phase and quadrature phase signals $f_k$ and said output frequency $f_{out}$, and to output a single sideband (SSB) modulated output $f_n$ comprising only one of the sum ($f_{out}+f_k$) or difference ($f_{out}-f_k$) products;
 a divide-by-n counter connected to receive said modulated output $f_n$ and to output a feedback frequency sample $f_f$;
 a phase detector connected to receive said feedback frequency sample $f_f$ and to compare it with a reference frequency $f_r$, and having a phase error output signal for connection to said VCO-control voltage input; and
 a crystal oscillator connected to provide a plurality of different reference frequencies $f_r$ to the phase detector such that particular combinations of n, k, and $f_r$ that produce spurious outputs in said frequency output $f_{out}$ are avoided by selecting a different $f_r$ that requires a different set of n and k for the same frequency output $f_{out}$.

5. A frequency synthesizer, comprising:
 a voltage controlled oscillator (VCO) having an output freauency $f_{out}$ that is dependent on a VCO-control voltage input;
 a divide-by-k counter and a further divider stage a pair of in-phase and quadrature-phase signals, $f_k$, the divide-by-k counter connected to receive said output frequency $f_{out}$;
 a vector modulator connected to receive said in-phase and quadrature phase signals $f_k$ and said output frequency $f_{out}$, and to output a single sideband (SSB) modulated output $f_n$ comprising only one of the sum ($f_{out}+f_k$) or difference ($f_{out}-f_k$) products;
 a divide-by-n counter connected to receive said modulated output $f_n$ and to output a feedback frequency sample $f_f$;
 a phase detector connected to receive said feedback frequency sample $f_f$ and to compare it with a reference frequency $f_r$, and having a phase error output signal for connection to said VCO-control voltage input; and
 a filter connected between the vector modulator and the divide-by-k counter to provide sinewave inputs to the vector modulator for said in-phase and quadrature phase signals $f_k$;
wherein spurious outputs in said frequency output $f_{out}$ are reduced; and
wherein, said filter comprises a frequency tracking switched-capacitor filter.

* * * * *